United States Patent
Nakano et al.

(10) Patent No.: US 8,987,680 B2
(45) Date of Patent: Mar. 24, 2015

(54) MULTIPOLE MEASUREMENT APPARATUS (75) Inventors: Tomonori Nakano, Tokyo (JP); Kotoko Urano, Tokyo (JP); Hiroyuki Ito, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/241,035

(22) PCT Filed: May 23, 2012

(86) PCT No.: PCT/JP2012/063135
§ 371 (c)(1),
(2), (4) Date: Apr. 23, 2014

(87) PCT Pub. No.: WO2013/035386
PCT Pub. Date: Mar. 14, 2013

(65) Prior Publication Data
US 2014/0217304 A1   Aug. 7, 2014

(30) Foreign Application Priority Data
Sep. 8, 2011   (JP) ................................. 2011-195872

(51) Int. Cl.
*G21K 5/04*   (2006.01)
*G21K 1/00*   (2006.01)
*H01J 37/153*   (2006.01)
(Continued)

(52) U.S. Cl.
CPC ................. *G21K 1/00* (2013.01); *H01J 37/153* (2013.01); *H01J 37/26* (2013.01); *H01J 2237/2446* (2013.01); *H01J 2237/2826* (2013.01); *H01J 37/244* (2013.01)
USPC ................. 250/397; 250/396 R; 250/396 ML (58) Field of Classification Search
USPC ...... 250/396 R, 397, 398, 396 ML, 305, 306, 250/307, 309, 310, 311
See application file for complete search history.

(56) References Cited

U.S. PATENT DOCUMENTS

2004/0029046 A1 *  2/2004  Nagano et al. ................ 430/296
2005/0189496 A1    9/2005  Uno
(Continued)

FOREIGN PATENT DOCUMENTS

JP   2005-183086 A   7/2005

OTHER PUBLICATIONS

Zach, J., et al., Aberration correction in a low voltage SEM by a multipole corrector, Nuclear Instruments and Methods in Physics Research A 363, 1995, pp. 316-325.
(Continued)

*Primary Examiner* — Nicole Ippolito
(74) *Attorney, Agent, or Firm* — Miles & Stockbridge P.C.

(57) ABSTRACT

In order to provide a multipole measurement apparatus that can easily obtain table data for an aberration corrector that corrects the aberrations in a charged particle beam apparatus, the multipole measurement apparatus, which is provided with an optical system (10), a space into which an aberration corrector (6) is to be inserted, and a position detector (7), measures the relationship between the incident position and angle of a primary charged particle beam on the aberration corrector (6) at a plurality of points, the irradiation position upon the position detector (7), and a multipole, in a state of having a multipole field excited and in a state of not having a multipole field excited, so as to extract multipole components contained in the measurement executed in the state of having the multipole field excited.

12 Claims, 9 Drawing Sheets

(51) Int. Cl.
*H01J 37/26* (2006.01)
*H01J 37/244* (2006.01)

(56) References Cited

U.S. PATENT DOCUMENTS

2009/0039281 A1* 2/2009 Kawasaki et al. ......... 250/396 R
2009/0212213 A1* 8/2009 Nakasuji et al. ............. 250/310

OTHER PUBLICATIONS

Uno, S., et al., "Aberration correction and its automatic control in scanning electron microscopes", Optik, 2005, vol. 116, No. 9, pp. 438-448.

* cited by examiner

MULTIPOLE MEASUREMENT APPARATUS

TECHNICAL FIELD

The present invention relates to a multipole measurement apparatus for adjusting an aberration corrector in a charged particle beam apparatus.

BACKGROUND ART

In a charged particle beam apparatus including an electron microscope such as a scanning electron microscope (SEM) and a transmission electron microscope (TEM), a lens is used which uses an electric field or a magnetic field for converging a charged particle beam. In the electric-field or magnetic-field lens, various types of aberrations occur inevitably. Therefore, even if the charged particle beam is tried to be narrowed by increasing a reduction rate, a spot diameter cannot be reduced in a case where the aberration is large, and observation of a microstructure and improvement of a dimension measurement accuracy and precision cannot be achieved.

In a charged particle beam apparatus, introduction of an aberration corrector is underway for improving resolution. This aberration corrector is constituted by multipole lenses provided in multiple stages, and removes an aberration by generating an electric field or a magnetic field in the multipole lenses. There is a plurality of types of aberrations, and appropriate setting of a multipole field is required in accordance with the types of aberrations.

Regarding the aberration corrector, there is one using four stages of 12-pole lenses, as disclosed in the following Non Patent Literature 1, for example. In the aberration corrector of Non Patent Literature 1, an adjustment method of a multipole field in accordance with types of aberrations is described as an aberration correction method.

The relationship between an aberration and a correction amount is disclosed in Non Patent Literature 2 or Patent Literature 1. Here, a relationship of the aberration and a combination of the multipole fields is derived by calculation under an ideal condition. Moreover, in Patent Literature 1, a technique is also disclosed which measures the aberration in the aberration corrector and corrects it. This technique acquires beam profile data from a plurality of images acquired while a focus is varied, obtains the aberration amounts of various types of geometric aberrations based on the acquired beam profile data, determines the correction amount to be input to the aberration corrector in accordance with the obtained aberration amounts, and removes the various types of aberrations.

The measurement of these aberrations, however, has to be performed by using a state in which a beam is in focus on a sample or a state in which the beam is slightly out of focus with respect to the state where the beam is in focus, as a reference. Maintaining the state in which the beam is in focus is easy to break because of effects of the aberration, and adjustment is required in a stage before a state in which the aberration measurement is possible. In this adjustment, processes have to be repeated, and adjustment time is a problem. Moreover, in these measurements, when only a specific element such as one kind of multipole field in one stage is made larger, the focus state cannot be maintained and therefore the measurement for every element is difficult. Because those measurements are difficult, the method of Non Patent Literature 2 has been considered.

A case is considered in which, in determination of a relationship between an aberration and the correction amount in advance, correction is made considering a deviation from an ideal state such as a mechanical positional deviation of a multipole in a corrector. In this case, when the aberration correction is made, an additionally generated aberration (a parasitic aberration) associated with the correction is further generated and has to be suppressed. In order to suppress this parasitic aberration, an auxiliary multipole field is excited in addition to a multipole field for a main purpose. Thus, when more sophisticated adjustment is considered, the relationship between the aberration and the correction amount requires a measurement of a combination of auxiliary multipole fields, in addition to a measurement of a relationship between an ideal multipole field and the correction amount, and a time required for that measurement is a problem. In addition, because the aberration amount depends on an electron optical condition, it is necessary to examine the relationship between the aberration and the correction amount for every electron optical condition. Thus, it takes a time corresponding to the number of the conditions.

Furthermore, in the aforementioned measurement of the relationship between the aberration and the correction amount, there is a disadvantage that, in a case where the parasitic aberration is large, a beam is out of a measurement range and the measurement cannot be performed. In order to avoid this, the measurement has to be repeated in fine steps, and the procedure becomes complicated.

CITATION LIST

Patent Literature

Patent Literature 1: JP-2005-183086-A

Non Patent Literature

Non Patent Literature 1: Nuclear Instruments and Methods in Physics Research, A363 (1995), pages 316-325

Non Patent Literature 2: Optik Vol. 116, No. 9, Pages 438-448

SUMMARY OF INVENTION

Technical Problem

In a stage before a full-fledged operation of an aberration corrector, table data is acquired in which a relationship of an intensity of a multipole field excited with respect to an intensity of an input value (a voltage or a current and allocation thereof), a relationship of an adjusting field required with respect to the intensity of the multipole filed, and the like are recorded. Here, a difference between an estimation in design and actual observation, which is caused by a positional deviation of a pole in manufacturing the pole, a difference of the intensity of the multipole field with respect to the input value (response characteristics with respect to the input value), or the like, is confirmed and recorded as an error factor. Also, a combination of adjusting fields and an intensity are recorded for suppressing an aberration (a parasitic aberration) generated differently from an originally intended effect in the multipole field. This measurement is performed in an electron microscope to which the aberration corrector is attached. However, observation in a scanning electron microscope requires a probe to be sufficiently narrowed (in a case of using secondary electrons). Therefore, it is necessary to operate the multipole fields of a plurality of stages together to be linked with each other, and separation of an element in which excitation of a multipole field is performed in only one stage is difficult. Without the separation of every element, different table data is needed for every condition. Thus, it takes a complicated effort and a time to acquire the table data for a numerous number of observation conditions required by an apparatus, and the operation may be limited because it cannot handle a condition which no measurement has been performed.

Moreover, in the observation in the above-described electron microscope in the state in which the probe is narrowed, a detection sensitivity is high because the observation is sensitive to even a minor change. However, in a case where a deflection field is largely included as an error of excitation of a multipole field, an electron beam is out of an objective lens for narrowing the probe and the observation cannot be performed, for example, that is, the observation is weak to a large change. Also, the measurement in acquiring the table data is limited. Therefore, it is necessary to acquire the table data by changing the intensity of the multipole field in relatively small steps and therefore it takes a time.

It is an object of the present invention to provide a multipole measurement apparatus which can easily acquire table data of an aberration corrector. Thus, adjustment of the aberration corrector can be performed in a short time, and mass production of the aberration corrector is possible.

Solution to Problem

The present invention provides an apparatus for measuring multipole field characteristics of an aberration corrector. This apparatus makes a charged particle beam pass through a condenser lens and the aberration corrector, radiates the charged particle beam which has passed onto an observation plate such as a fluorescent plate, and performs observation of a radiation position or a beam profile of the radiated charged particle beam on the observation plate. Between the condenser lens and the aberration corrector, deflection coils are provided, so that a position of incidence and a convergence angle of the charged particle beam with respect to the aberration corrector.

When a given multipole field is excited in the aberration corrector, the radiation position and the beam profile of the charged particle beam on the observation plate are changed in principle by setting parameters including the type and magnitude of the multipole field and the position of incidence and the convergence angle of the charged particle beam to the multipole field. Moreover, the radiation position and the beam profile of the charged particle beam on the observation plate are also changed by an error factor such as a positional deviation of a pole and response characteristics with respect to an input current or voltage, other than the principle factors such as those setting parameters. The present invention changes the above-described setting parameters, measures the radiation position on the observation plate, and calculates a table which cancels the error factor when the multipole field is excited.

Advantageous Effects of Invention

According to an apparatus of the present invention, multipole field characteristics of an aberration corrector can be examined, and screening of the aberration corrector can be performed before it is mounted to a charged particle beam apparatus such as an electron microscope. Moreover, since a charged particle beam can be directly observed, a fine adjustment or limitation is not necessary as compared with a case of using secondary electrons, and examination and table creation can be performed easily at high-speed. Furthermore, since the examination can be performed for a limited element such as a single stage, separation of a problem and versatile data acquisition can be performed. Since a plurality of aberration correctors can be examined by the same apparatus, the examination can be performed under a stable condition, leading to improvement in quality.

DESCRIPTION OF EMBODIMENTS

An example is described using an example in which this apparatus is used for a 4-8 pole type aberration corrector.

First Example

Figure 1:
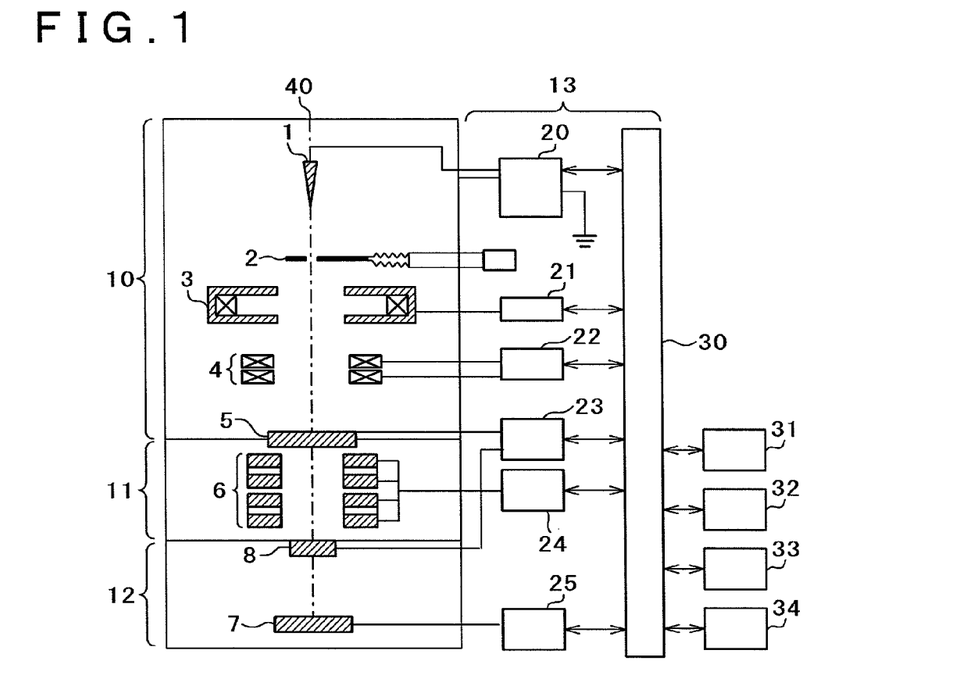
FIG. 1 is a schematic diagram of an entire structure of a multipole measurement apparatus according to a first example.

FIG. 1 shows a schematic diagram of an entire structure of a multipole measurement apparatus according to a first example of the present invention. The structure is generally constituted by an electron gun column 10 which radiates and deflects an electron beam, an aberration corrector column 11 in which an aberration corrector is accommodated, an observation room 12 in which an observation plate is accommodated, and a control unit 13 for controlling respective component parts. To the control unit 13, an arithmetic device 31 for calculating an adjusting amount and a deviation amount, an operation console 32 serving as a man-machine interface between the apparatus and a user of the apparatus, a monitor 33 for displaying acquired information, and a memory 34 for storing predetermined information are further connected. The operation console 32 is constituted by an information input unit such as a keyboard or a mouse, for example.

First, the components including the electron gun column 10, the aberration corrector column 11, and the observation room 12 are described. The electron gun column 10, the aberration corrector column 11, and the observation room 12 are connected to one another and operate as a single device while the inside thereof is evacuated. The aberration corrector column 11 can be disconnected so that it can be replaced with another aberration corrector. In a case of performing disconnection, a vacuum valve 5 and a vacuum valve 8 are closed and the vacuum in the electron gun column 10 and in the observation room 12 are maintained. An electron gun 1 discharges an electron beam at a predetermined voltage by an electron-gun power source 20, and the discharged electron beam is incident on a component in a later stage along an optical axis 40. The electron beam is limited in its beam current by an aperture 2, is converged by a condenser lens 3, passes through deflection coils 4 and an aberration corrector 6, and is radiated onto an observation plate 7. During an operation, the vacuum valve 5 and the vacuum valve 8 are opened by a vacuum-valve control unit 23, so that there is nothing blocking the electron beam from the electron gun 1 to the observation plate 7. The deflection coils 4 are connected to a control computer 30 through a deflection-coil power source 22, so that deflection can be performed with a given magnitude, toward a given direction, and at a given timing by the control computer 30. Reference sign 21 denotes a condenser-lens power source.

The aberration corrector 6 in the aberration corrector column 11 has 12-poles in four stages. Each pole is connected to an aberration-corrector power source 24, so that either one or both of an electric field and a magnetic field having a given magnitude can be generated for each pole. The 12-pole can form multipole fields of an electric or magnetic field, such as a dipole field, a quadrupole field, a hexapole field, and an octupole field, by combinations of input values of the aberration-corrector power source 24 to the 12-pole. The multipole fields can be created to be overlapped with each other, and the magnitude, the type, and the phase thereof, and the stage where the formation is performed are determined by the control computer 30 connected to the aberration-corrector power source 24.

For the observation plate 7 inside the observation room 12, a current amount and a position of an electron beam radiated onto the observation plate 7 are detected. The detected information is sent by an imaging unit 25 to the control computer 30. The same reference signs denote the same components.

Next, an operation of this multipole measurement apparatus is described. The operation is roughly divided into axis confirmation (alignment), a measurement of a multipole field, and calculation of an adjusting value (an auxiliary field) for the multipole field. In this example, although individual description is omitted, a multipole using a magnetic field may perform a degaussing operation when changing an excitation intensity for improving the reproducibility of an excited state of the multipole. Moreover, this example is performed under a condition of a constant accelerating voltage. In an actual measurement, the same measurement is performed for all accelerating voltages to be used.

The axis confirmation is described. The axis confirmation is performed by two-dimension scan with an electron beam 41 (see FIG. 2A, for example) on the aberration corrector 6 parallel to the optical axis 40 by the deflection coils 4. First, two-dimensional scan is performed by the deflection coils 4 while no multipole field (or a given value) is excited in the aberration corrector 6, and a relationship between an input value of the deflection coils 4 and a position observed on the observation plate 7 during the two-dimensional scan is recorded. Next, the intensity of the input value of one multipole field is changed in the aberration corrector 6, two-dimensional scan is performed again, and the relationship between the input value of the deflection coils 4 and the position observed on the observation plate 7 during the two-dimensional scan is recorded. An electron beam passing on an axis of the multipole field reaches the same position irrespective of the excitation intensity of the multipole field. Therefore, by comparing the results before and after the change of the multipole field, a point for which the change of the position observed on the observation plate 7 with respect to the input values of the deflection coils 4 during the two-dimensional scan is the smallest can be detected as a position of the axis.

This axis confirmation is performed by performing two-dimensional scan by the deflection coils 4 parallel to the optical axis 40. However, there is a method for checking the axis while the two-dimensional scan is inclined if a coordinate can be specified. Moreover, as a method for examining the axis position quickly and accuracy, there is a method in which, in a case where the number of samplings during two-dimensional scan is assumed to be constant, two-dimensional scan is performed roughly in a wide area and then the scan area is made narrower gradually to include an area having the smallest movement as the center.

Although this axis confirmation can be applied to any multipole, setting of the axis in the multipole field measurement is desirably performed by using a quadrupole which is mainly used for forming an orbit as a reference. However, the axis position is usually different between four stages and the multipole field measurement uses an axis set for each stage as the reference. The differences of the axis position between the stages are recorded and can be used for estimation of an offset amount of a dipole field required for alignment for each stage when the aberration corrector 6 is installed in an SEM. This is because, even in the same stage, the axis position is varied between multipole fields in many cases and all the axes cannot be made coincident with each other. Therefore, for a multipole having a different axis position from the axis of the quadrupole, it is handled as a dipole component in the multipole field measurement.

The multipole field measurement is described. The multipole field measurement in this example is performed, after the axis confirmation, by making the electron beam 41 rotate around the axis obtained by the aforementioned axis confirmation by the deflection coils 4 and pass through the aberration corrector 6, detecting the position of the electron beam 41 on the observation plate 7 at that time, and examining a relationship between the detected position and an incidence position to the aberration corrector 6.

Figure 2A:
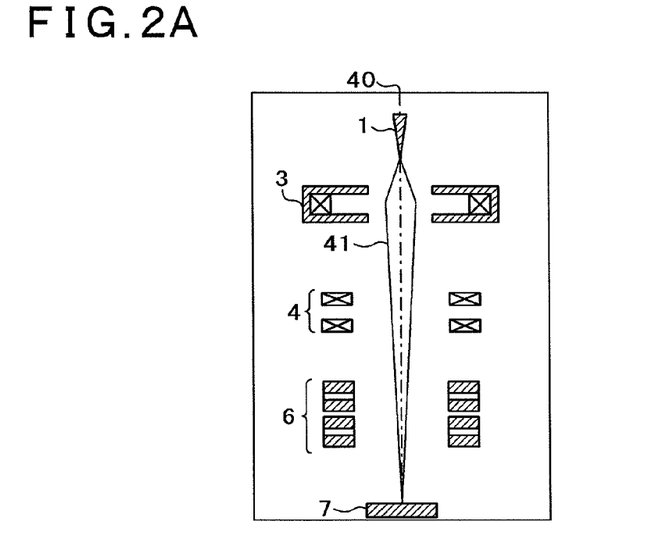
FIG. 2A is an apparatus diagram for illustrating an orbit of an electron beam in the multipole measurement apparatus shown in FIG. 1.
Figure 2B:
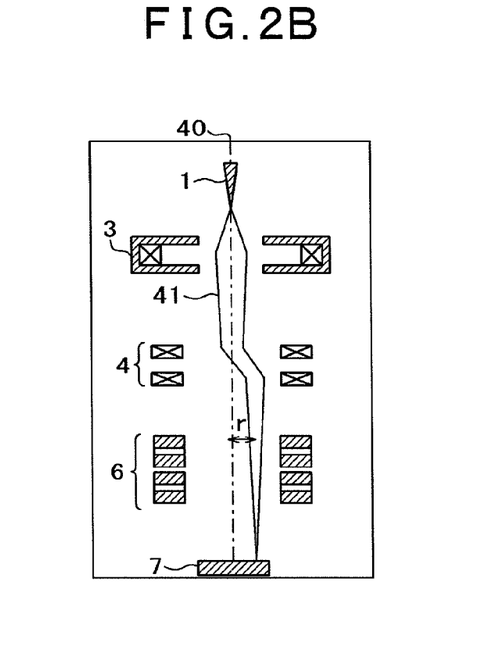
FIG. 2B is an apparatus diagram for illustrating an orbit of the electron beam in the multipole measurement apparatus shown in FIG. 1.

Rotation of the electron beam 41 is described by using schematic diagrams of the multipole measurement apparatus shown in FIGS. 2A to 2D. In this example, it is assumed that the axis position confirmed in the axis confirmation is coincident with the optical axis 40. FIG. 2A shows a state where the electron beam 41 has not been rotated. The electron beam 41 is converged by the condenser lens 3 on the observation plate 7. The rotation of the electron beam 41 is performed by adjusting the deflection coils 4 from this state in such a manner that the electron beam 41 enters the aberration corrector 6 parallel to the optical axis 40 with a distance equal to a constant radius r from the optical axis 40, as shown in FIG. 2B.

Figure 3A:
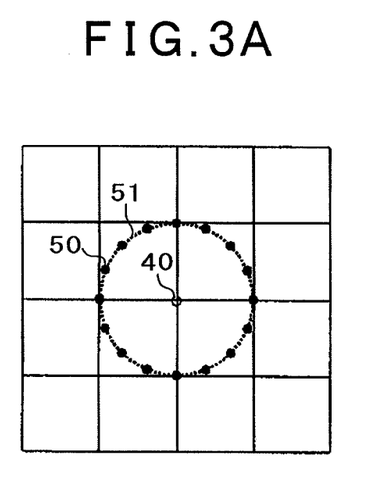
FIG. 3A is an illustration showing an exemplary path of a radiation point of the electron beam on an observation plate in the multipole measurement apparatus shown in FIG. 1.
Figure 3B:
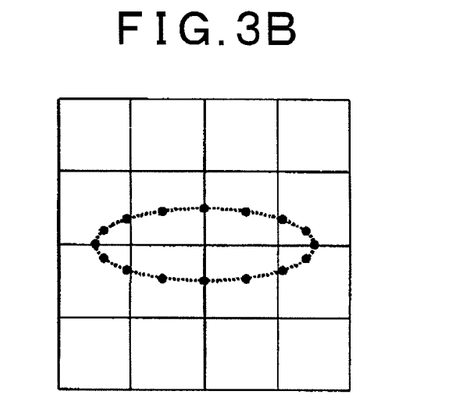
FIG. 3B is an illustration showing another exemplary path of the radiation point of the electron beam on the observation plate in the multipole measurement apparatus shown in FIG. 1.
Figure 3C:
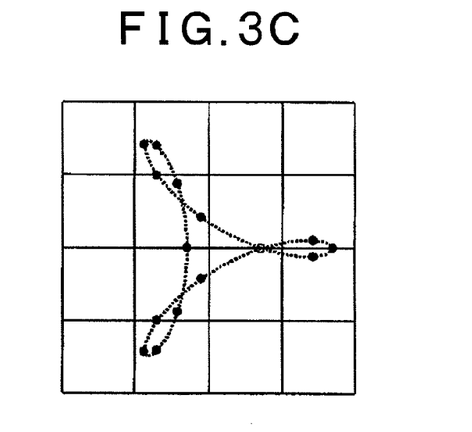
FIG. 3C is an illustration showing another exemplary path of the radiation point of the electron beam on the observation plate in the multipole measurement apparatus shown in FIG. 1.
Figure 3D:
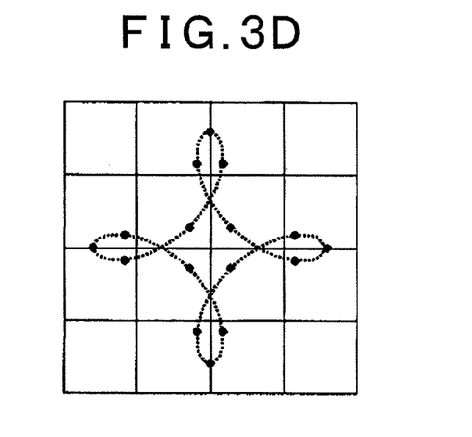
FIG. 3D is an illustration showing another exemplary path of the radiation point of the electron beam on the observation plate in the multipole measurement apparatus shown in FIG. 1.
Figure 3E:
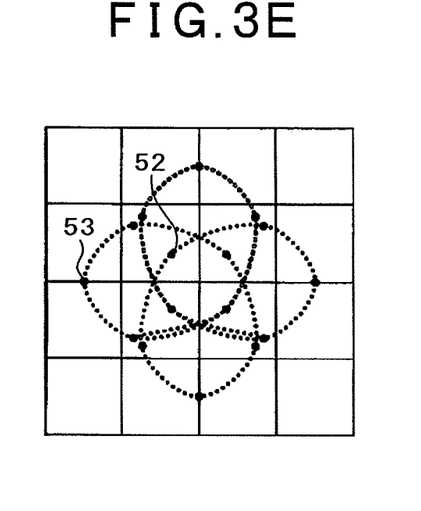
FIG. 3E is an illustration showing another exemplary path of the radiation point of the electron beam on the observation plate in the multipole measurement apparatus shown in FIG. 1.

As exemplary results obtained by respective multipole measurements, the electron beam 41 can be rotated by the deflection coils 4, and can be observed on the observation plate 7, as shown in FIGS. 3A to 3E, by being affected by a multipole field excited in the aberration corrector 6. The results can be output to a monitor 33. In FIGS. 3A to 3E, a radiation point 50 of the electron beam 41 on the observation plate 7 is shown as an example, and the movement of the radiation point of the electron beam associated with the rotation of the electron beam 41 is shown as a path 51. A case of no multipole field is shown in FIG. 3A, a case of being affected by a quadrupole field is shown in FIG. 3B, a case of being affected by a hexapole is shown in FIG. 3C, and a case of being affected by an octupole is shown in FIG. 3D. Moreover, a case in which the intensity of the octupole is enhanced is shown in FIG. 3E. These shapes are determined by a relationship between an effect of the multipole field of the aberration corrector 6 and the incidence of the electron beam 41 to the aberration corrector 6. Please note that reference sign 52 in FIG. 3E denotes a radiation point inside a profile of the electron beam and reference sign 53 denotes a radiation point on an outer periphery of the profile of the electron beam.

Figure 4:
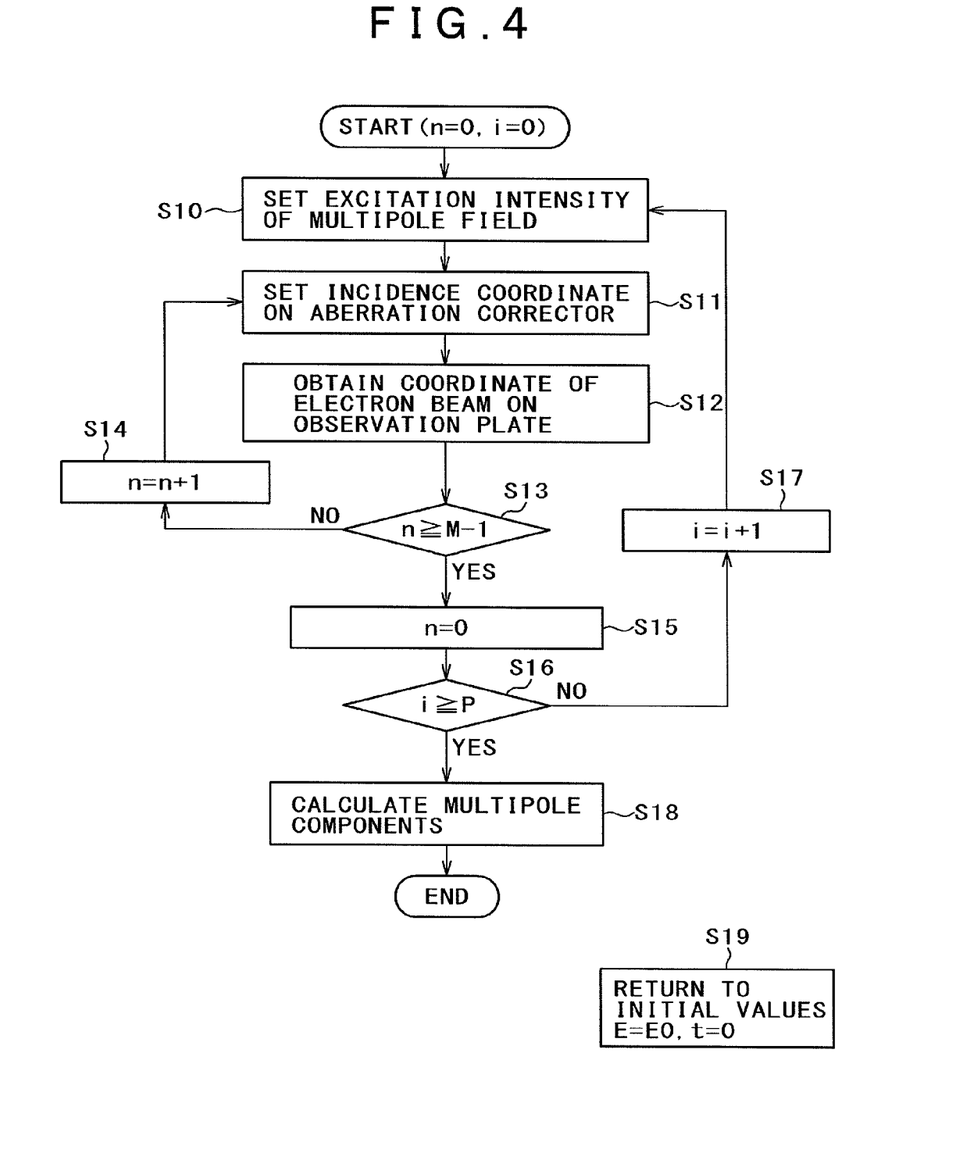
FIG. 4 is a flowchart when a multipole field is measured by using the multipole measurement apparatus shown in FIG. 1.

A flow of the multipole field measurement is described by using FIG. 4. Here, the electron beam 41 travels on a circumference having a radius r from the axis, at M points equidistantly. Moreover, the intensity of the multipole field is changed P+1 times from 0 by $\Delta T$ and the measurement is performed to $\Delta T \times P$. In this example, arbitrary integers n and i are used as counters.

Step S10: The excitation intensity of the multipole field of the aberration corrector 6 is set to $\Delta T \times i$ by controlling the aberration-corrector power source 24 by the control computer 30.

Step S11: By the control computer 30, the deflection coils 4 are controlled to set a coordinate of incidence to the multipole field of the aberration corrector 6. The coordinate of incidence $(x_{ni}, y_{ni})$ to the aberration corrector 6 is expressed by Equation (1).

[Expression 1]

$$(x_{ni}, y_{ni}) = (r \cos(2\pi \times n/M), r \sin(2\pi \times n/M)) \quad (1)$$

The coordinate of incidence $(x_{ni}, y_{ni})$ can be calculated from an input value such as a current or a voltage to the deflection-coil power source 22.

Step S12: A coordinate of radiation $(X_{ni}, Y_{ni})$ of the electron beam 41 on the observation plate 7 is acquired. The detected coordinate of radiation of the electron beam is sent to the control computer 30 by the imaging unit 25, and is recorded in the memory 34 in synchronization with the coordinate of incidence of the electron beam set in Step S11.

Step S13: By using the counter n, it is determined whether or not a prescribed operation (moving at M points) has been finished. If the operation has been finished, the flow goes to Step S15. Otherwise, the flow goes to a process in Step S14. M has to be 6 or larger for extraction to an octupole component, and is desirably a power of 2 for easy calculation.

Step S14: The counter n is incremented by 1, and the flow goes to Step S11 again.

Step S15: The counter n is reset to 0.

Step S16: Using the counter i, it is determined whether or not a prescribed operation (change of a multipole intensity) has been finished. If the operation has been finished, the flow goes to Step S18. Otherwise, the flow goes to a process in Step S17.

Step S17: The counter i is incremented by 1, and the flow goes to Step S10 again.

Step S18: From the relationship between the coordinate of incidence $(x_{ni}, y_{ni})$ and the coordinate of radiation $(X_{ni}, Y_{ni})$, which is stored in the memory 34, multipole components $((Dc, Ds), (Qc, Qs), (Hc, Hs), (Oc, Os))_i$ are calculated for the intensity $\Delta T \times i$. The multipole components express that Dc is a dipole cosine component, Ds is a dipole sine component, Qc is a quadrupole cosine component, Qs is a quadrupole sine component, Hc is a hexapole cosine component, Hs is a hexapole sine component, Oc is an octupole cosine component, and Os is an octupole sine component. How to calculate those will be described later.

Regarding the above-described Steps S11, S12, and S18, a multipole arrangement in the aberration corrector 6, the coordinate of the electron beam 41, and the coordinate on the observation plate 7 are calibrated in advance, and a coordinate system of obtained adjustment table data and a mechanical positional relationship of the aberration corrector 6 are managed to correspond to each other. Thus, when the aberration corrector 6 is incorporated into an electron microscope, the multipole position of the aberration corrector 6 can be referred to and calibration of the coordinate system of the adjustment table and a coordinate system of the electron microscope apparatus can be easily performed.

In this example, the multipole field measurement is described only for one multipole field. An actual measurement is performed while each multipole field is excited alone in each of all the stages of the four-stage multipoles of the aberration corrector 6. The processes are the same irrespective of the multipole fields. The respective multipole fields measured here mean a dipole field, a quadrupole field, a hexapole field, and an octupole field. Moreover, each of the multipole fields is measured for two types, i.e., a cosine distribution and a sine distribution. In addition, a multipole of a magnetic field and that of an electric field are measured as different types of multipole fields, respectively. Step S19 shows a process for resetting values to initial values.

Next, how to calculate the multipole components in Step S18 is described. In the calculation, the multipole components can be calculated by Fourier series expansion for each of x- and y-coordinates while the coordinate of radiation $(X_{ni}, Y_{ni})$ is regarded as a function of n. However, for the quadrupole field component, it is necessary to remove a beam rotation component. Each multipole component is varied in proportion to the distance from the position of the multipole to the observation plate 7, and is a relative index. The relationship between the respective components $((Dc, Ds), (Qc, Qs), (Hc, Hs), (Oc, Os))_i$ and the coordinate of radiation $(X_{ni}, Y_{ni})$ can be described by Equations (2-1) and (2-2) while the rotation component is assumed to be (Rc, Rs).

[Equation 2]

$$X_{ni} = Dc + (Rc+Qc) \times \cos(2\pi \cdot n/M) + (Qs-Rs) \times \sin(2\pi n/M) + Hc \times \cos(4\pi n/M) + Hs \times \sin(4\pi n/M) + Oc \times \cos(6\pi \cdot n/M) + Os \times \sin(6\pi \cdot n/M) \quad (2\text{-}1)$$

$$Y_{ni} = Ds + (Rc-Qc) \times \sin(2\pi \cdot n/M) + (Qs+Rs) \times \cos(2\pi \cdot n/M) - Hc \times \sin(4\pi \cdot n/M) + Hs \times \cos(4\pi \cdot n/M) - Oc \times \sin(6\pi \cdot n/M) + Os \times \cos(6\pi \cdot n/M) \quad (2\text{-}2)$$

(In a case where an initial phase of the R component is 0, Rs=0) Because the calculated values are varied by the intensity of each component, the incident condition, and the distance from the multipole to the observation plate, the calculated values are used as relative indices. If strict calibration is performed, those values can be used as absolute values for a measurement.

Calculation of the adjusting amount from the measurement results is described. The calculation of the adjusting amount is to calculate, when a multipole w (w=2, 4, 6, and 8, cosine and sine distributions for each) is assumed, a combination of excitation of auxiliary multipole components (($k_{w2c}$, $k_{w2s}$), ($k_{w4c}$, $k_{w4s}$), ($k_{w6c}$, $k_{w6s}$), and ($k_{w8c}$, $k_{w8s}$)) defined by a coefficient $k_{wj}$ for the input value as an auxiliary field with respect to the intensity $a_w$ of the input value of the w-pole intensity. In a case where the intensity of the input value of the w-pole field is assumed to be $a_w$, when an intensity of the j-pole field component (j=2c, 2s, 4s, 4c, 6c, 6s, 8c, and 8s, and c and s represent cosine and sine, respectively) (e.g., when j=2c, a dipole cosine component Dc is represented) output as actual multipole fields is assumed to $b_{wj}$, that combination is expressed by the following equation.

[Equation 3]

$$B_w = \begin{pmatrix} b_{w2c} & b_{w2s} \\ b_{w4c} & b_{w4s} \\ b_{w6c} & b_{w6s} \\ b_{w8c} & b_{w8s} \end{pmatrix} \quad (3)$$

$b_{ww}$ is called as a main component because it is an originally intended multipole field component with respect to excitation of the w-pole, and others are called as sub components. In adjustment, it is enough that the sub components become 0 with respect to multipole excitation, and, when an output value of the w-pole field is assumed to be $c_j$, it is enough that $c_j$=0 is satisfied for j≠w. Here, for adjustment, a combination of (($k_{w2c}$, $k_{w2s}$), ($k_{w4c}$, $k_{w4s}$), ($k_{w6c}$, $k_{w6s}$), ($k_{w8c}$, $k_{w8s}$)) is added as auxiliary components to the intensity $a_w$ of the input value of the w-pole intensity ($k_{jj}$=1). As a specific example, in a case where excitation of a quadrupole field cosine distribution (w=4c) is performed, a multipole component satisfying Equation (4) is added as an auxiliary field.

[Equation 4]

$$C = \begin{pmatrix} 0 & 0 \\ C_{4c} & 0 \\ 0 & 0 \\ 0 & 0 \end{pmatrix} = a_{4c}B_{4c} + a_{4c}k_{4c2c}B_{2c} + a_{4c}k_{4c2s}B_{2s} + a_{4c}k_{4c4s}B_{4s} + \\ a_{4c}k_{4c6c}B_{6c} + a_{4c}k_{4c6s}B_{6s} + a_{4c}k_{4c8c}B_{6c} + a_{4c}k_{4c8s}B_{8s} \quad (4)$$

However, under some conditions, there is no solution or a solution is not really effective. For example, in a case where the main component $C_{4c}$ comes closer to 0, there is no effective solution. In order to avoid those, a threshold value is set for the coefficient and, within that range, a condition in which the main component is the largest with respect to the input value or a condition in which a ratio of the main component to the sub components is the largest is selected. Moreover, in a case where the ratio of the main component to the sub components does not satisfy a standard, the performance is determined to be insufficient. That is, this can be used for selection of an aberration corrector.

As an example in which calculation of the above-described coefficient is further simplified, for an auxiliary field in a case where a w-pole field is excited, a multipole component $b_{nj}$ in the auxiliary field of the n-pole field is processed by considering the main component $b_{nn}$ and the sub component $b_{nw}$ of the auxiliary field only and regarding the others as $b_{nj}$=0. As a specific example, in a case where a quadrupole field cosine distribution (w=4c) is excited, Equation (4) is calculated as Equation (5-1). Please note that g in Equation (5-1) is expressed by Equation (5-2).

[Equation 5]

$$C = \begin{pmatrix} 0 & 0 \\ c_{4c} & 0 \\ 0 & 0 \\ 0 & 0 \end{pmatrix} \approx \begin{pmatrix} a_{4c}(b_{4c2c}+k_{4c2c}b_{2c2c}) & a_{4c}(b_{4c2s}+k_{4c2s}b_{2s2s}) \\ g & a_{4c}(b_{4c4s}+k_{4c4s}b_{4s4s}) \\ a_{4c}(b_{4c6c}+k_{4c6c}b_{6c6c}) & a_{4c}(b_{4c6s}+k_{4c6s}b_{6s6s}) \\ a_{4c}(b_{4c8c}+k_{4c8c}b_{8c8c}) & a_{4c}(b_{4c8s}+k_{4c8s}b_{8s6s}) \end{pmatrix} \quad (5\text{-}1)$$

$$g = a_{4c}(k_{4c2c}b_{2c4c} + k_{4c2s}b_{2s4c} + b_{4c4c} + k_{4c4s}b_{4s4c} + \\ k_{4c6c}b_{6c4c} + k_{4c6s}b_{6s4c} + k_{4c8c}b_{8c4c} + k_{4c8s}b_{8s4c}) \quad (5\text{-}2)$$

A set of coefficients in the above-described calculation is acquired while an intensity of a given multipole field as an input value is changed. In an actual multipole field, a small adjusting value may be meaningless because of problems of hysteresis and long-term stability, and effects of the main component are the majority. Therefore, this simplification is practically effective.

By calculating the adjusting amount for which the sub components become zero and creating a table including the obtained value, the aberration corrector can be easily adjusted when being attached to a charged particle beam apparatus. The calculation of the adjusting amount and the creation of the table including the obtained value can be made by the arithmetic device 31.

In the measurement of multipole field components, the relationship of the radiation position on the observation plate 7 with respect to the position of incidence to the aberration corrector 6 is used. This is used as phase information for easy calculation of Fourier series expansion used in calculation of an approximation expression to the paths obtained in FIGS. 3A to 3E.

As a supplemental note of detection of the radiation position of the electron beam 41 on the observation plate 7, the electron beam expands to some extent at the radiation position and is not converted onto one point in some cases. In those cases, a position of a center of gravity of the expansion of the electron beam or a position at which the electron beam has the largest brightness after passing through a noise filter is used. Moreover, in order to prevent the expansion itself, it is effective to make the expansion of the electron beam at the position of incidence to the aberration corrector 6 relatively smaller with respect to the rotation radius r from the axis in the measurement.

In addition, regarding the radiation position of the electron beam 41 on the observation plate 7, a drift of a radiation point of the electron beam occurs in some cases because of charging or power-source stability. Considering a measurement time, the drift is classified into stability in a short term of several minutes and stability in a long term of several hours. Moreover, the stability is determined whether or not it affects an accuracy required for position detection. The measurement time in this example is considered to be within several hours as a whole, and for one set of coordinate acquisition in a given excited state from Steps S10 to S15 in the flow of FIG. 4, as an individual operation, it is considered to be within one minute. The effects of the drift can be confirmed by comparing the radiation position of the electron beam under the same condition before and after the drift. Even in a case completely the same condition cannot be achieved, for example, in a case where a multipole is excited, the effects of the drift can be confirmed by setting the position of incidence of the electron beam 41 on the position of the axis. Moreover, in Step S10, the axis confirmation and re-alignment may be performed every time. Therefore, for the stability for long term of several minutes or longer, it can be handled by adding the drift confirmation to the measurement operation. Regarding the short-term stability, it is handled by being included in a required specification of a power source. In this measurement, an electron beam size or position accuracy is considered to be several microns and it is larger in size than that in a normal electron microscope by several digits. Therefore, the effects of the drift can be ignored if a power source with normally used stability is used in an electron microscope.

The description of the example has been completed. In the following description, an example of an alternative method is shown for an individual operation of the flow.

Figure 2C:
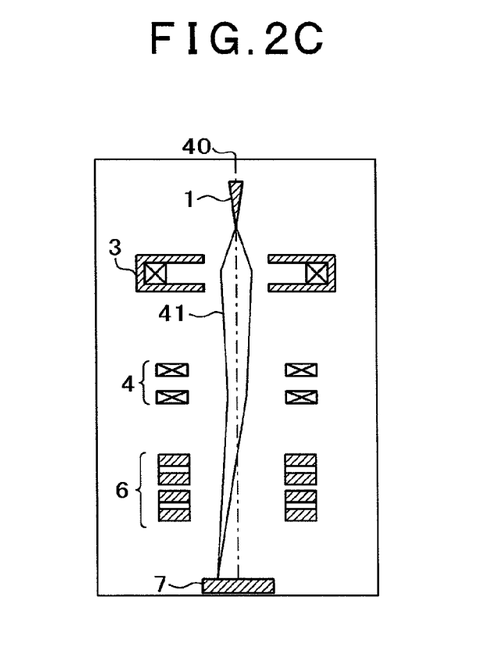
FIG. 2C is an apparatus diagram for illustrating an orbit of the electron beam in the multipole measurement apparatus shown in FIG. 1.
Figure 2D:
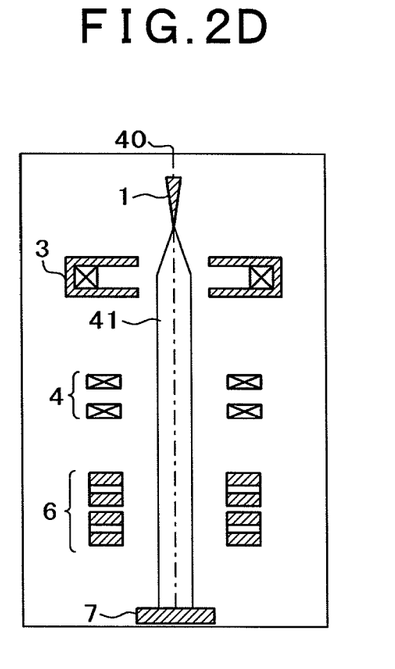
FIG. 2D is an apparatus diagram for illustrating an orbit of the electron beam in the multipole measurement apparatus shown in FIG. 1.

In the multipole component measurement, there is also a method in which determination is made from a shape of a beam profile which is formed by the electron beam 41 radiated onto the observation plate 7, while the electron beam 41 is allowed to expand on the observation plate 7 without being converged by the condenser lens 3, and the electron beam 41 is not rotated by the deflection coils 4 with the axis of the aberration corrector 6 aligned, as shown in FIG. 2D. The shape of the beam profile corresponds to the paths of radiation point of the electron beam in FIGS. 3A to 3E. However, information corresponding to a phase in the measurement using the movement of the electron beam cannot be obtained by this method. Moreover, for a case in which the shape of the beam profile has a portion which is turned inside, such as the example of FIG. 3E, it is possible to distinct the path including the radiation point 52 and the radiation point in the measurement using the movement of the electron beam, whereas from the profile shape only the outer peripheral portion passing through the radiation point 53 can be determined and information sufficient for calculation cannot be obtained. That is, this method has such a disadvantage and an application range thereof is limited.

Regarding the moving of the electron beam 41 by the deflection coils 4 in the measurement of the multipole field components, the measurement is performed with a fixed rotation radius in this example. However, for some intensities of a multipole field generated in the aberration corrector 6, the radiation position of the electron beam 41 on the observation plate 7 may be out of an observable range of the observation plate 7. In that case, the radiation position is placed in the observable range of the observation plate 7 by changing the radius of rotation of the electron beam 41 by the deflection coils 4. At this time, calculation of each multipole component is performed considering the change of the rotation radius. Specifically, while a quadrupole component is in linear proportion to the radius, an octupole component is in cubic proportion thereto.

Regarding the moving of the electron beam 41 by the deflection coils 4 in the measurement of the multipole field components, a case is shown in which the electron beam is incident parallel to the optical axis 40, as shown in FIG. 2B. However, there is also a method in which the electron beam is inclined to a certain extent with respect to the optical axis 40, as shown in FIG. 2C. In this case, the position of incidence of the electron beam is different between the stages and therefore a deviation of the position of incidence has to be considered in calculation. Moreover, because the comparison is performed under different conditions, attention is required when a relative difference is taken into consideration, so that an error is not included. An advantage is that the deflection coils 4 can be operated as one-stage deflection, and its operation is simplified more than that in two-stage deflection, and the deflection amount per current can be increased as compared with two-stage deflection.

Figure 5A:
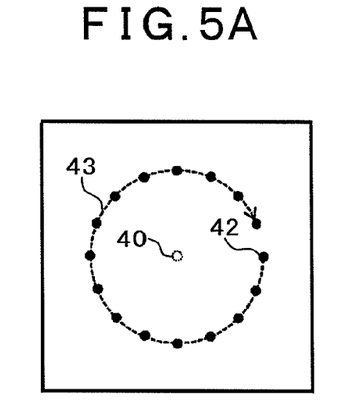
FIG. 5A is an illustration showing an exemplary deflection pattern of an incident electron beam to a multipole when the multipole field is measured by using the multipole measurement apparatus shown in FIG. 1.
Figure 5B:
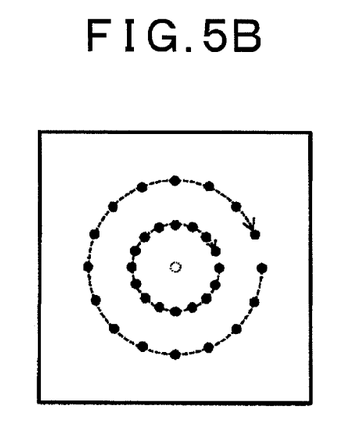
FIG. 5B is an illustration showing another exemplary deflection pattern of the incident electron beam to the multipole when the multipole field is measured by using the multipole measurement apparatus shown in FIG. 1.
Figure 5C:
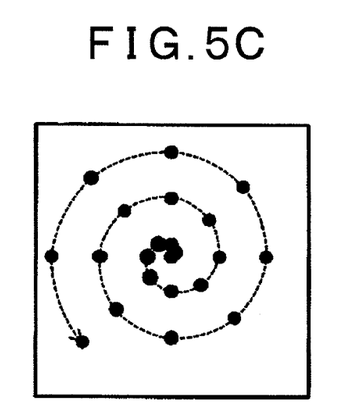
FIG. 5C is an illustration showing another exemplary deflection pattern of the incident electron beam to the multipole when the multipole field is measured by using the multipole measurement apparatus shown in FIG. 1.
Figure 5D:
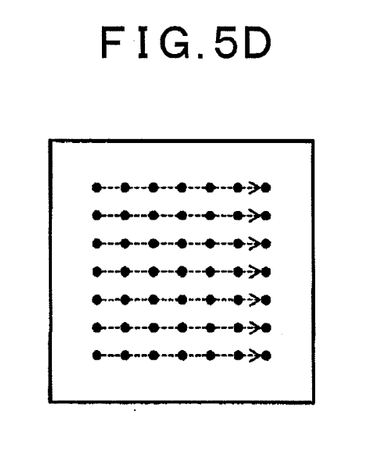
FIG. 5D is an illustration showing another exemplary deflection pattern of the incident electron beam to the multipole when the multipole field is measured by using the multipole measurement apparatus shown in FIG. 1.

Regarding the moving of the electron beam 41 by the deflection coils 4 in the measurement of the multipole field components, the example shows a circular pattern (FIG. 5A). However, any pattern is possible, as long as incidence of the electron beam 41 to the aberration corrector 6 contains a plurality of different coordinates of eight or more points other than the axis, such as a combination of circular patterns having different radii as shown in FIG. 5B, a spiral pattern as shown in FIG. 5C, and a two-dimensional scan pattern as shown in FIG. 5D. The pattern is related to easiness of calculation and the accuracy. The circular pattern allows easy calculation because it is simple. Reference sign 42 denotes an incident point of the electron beam, and reference sign 43 denotes a path of the incident point of the electron beam.

Regarding the moving of the electron beam 41 by the deflection coils 4 in the measurement of the multipole field components, as a method in which the multipole components are not obtained from the coordinate position of the radiation point on the observation plate 7, there is a method in which: the input value of the deflection coils 4 is controlled so that, for a plurality of positions of incidence other than the axis, the radiation position observed on the observation plate 7 when a multipole field is excited is coincident with that when the multipole field is not excited; a difference between that input value and an input value of the deflection coils 4 when no multipole field is excited is obtained; and the multipole components are detected from that difference. An advantage is that visual confirmation of cancel is easy. A disadvantage is that control of the electron beam 41 is required and it takes an extra time to correspond thereto.

As a method of using the obtained result, not only the obtained result is simply used as an adjusting table, but also it can be used for selection of incorporation which minimizes the aberration or the adjusting amount when the aberration corrector 6 is mounted in an SEM. This is because, while the aberration corrector 6 form lines of focus in the second and third stages, as shown in Non Patent Literature 1, an effect of an aberration is different between incorporated directions in a case where an orbit direction is determined in the SEM because of difference in sensitivity between the directions of the lines of focus.

Figure 6:
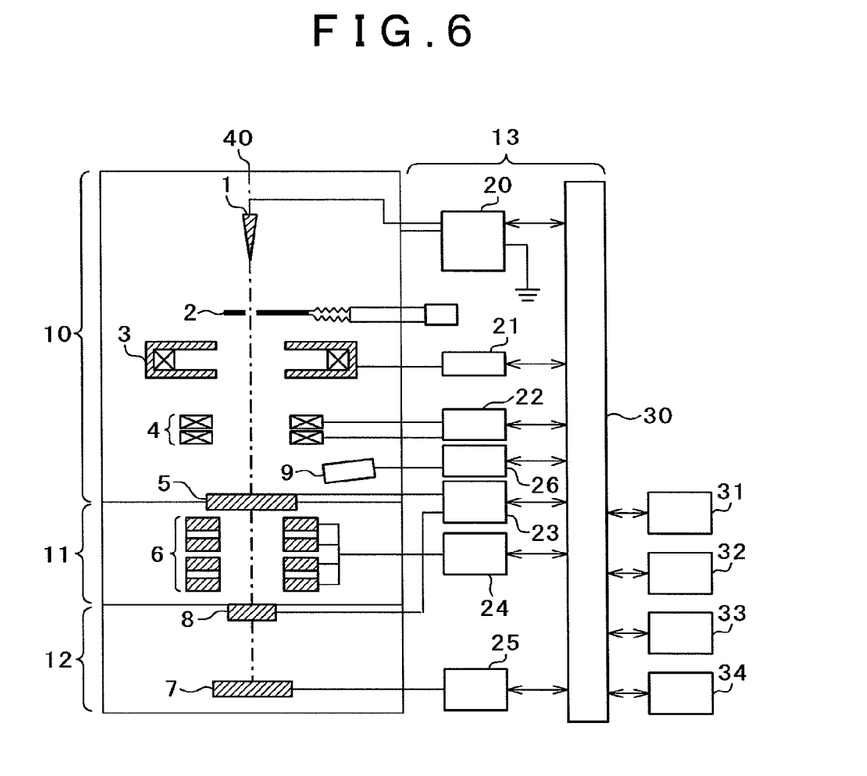
FIG. 6 is a schematic diagram of an entire structure of another exemplary multipole measurement apparatus according to the first example.

In addition to observation of the multipole field of the aberration corrector 6, this apparatus may include a secondary-electron detector 9 in the electron gun column 10 and perform two-dimensional scan by the deflection coils 4, thereby performing an SEM operation with respect to an uppermost multipole in the aberration corrector 6 and examining the multipole shape. In this case, the vacuum valve 5 is arranged to have a sufficient size for observation of the multipole of the aberration corrector 6. Reference sign 26 is a secondary-electron-detector power source.

Moreover, since this apparatus includes a vacuum gauge (not shown), a vacuum test and a withstand voltage test by the aberration-corrector power source can be also performed together. Switch from an atmosphere to a vacuum is performed in a state where the vacuum valve 5 is closed. Evacuation may be performed from a sample room (observation room) 12 while the vacuum valve 8 is opened, or may be performed from a pipe different from the electron gun column 10 and the observation room 12 while an exhaust port is provided in the aberration corrector column 11 and the vacuum valve 8 is closed. For stabilizing the apparatus, it is important to maintain the vacuum in the electron gun column 10.

As specific examples of a two-dimensional image sensor as the two-dimensional position detector of the observation plate 7, there are a micro channel plate (MCP) and a combination of a fluorescent plate and a camera.

Figure 7:
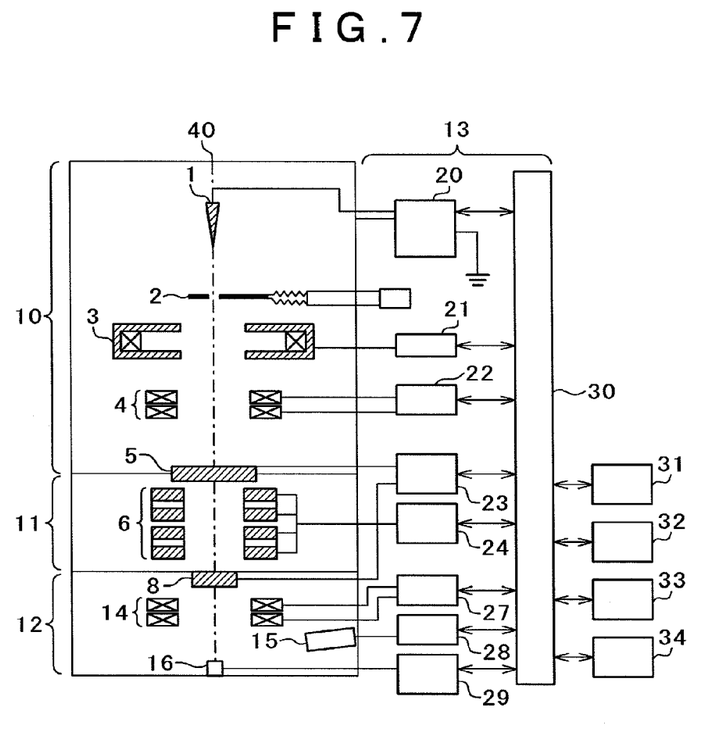
FIG. 7 is a schematic diagram of an entire structure of another exemplary multipole measurement apparatus according to the first example.

As an exemplary method which does not use an image sensor in the observation plate 7, there is a method for performing detection of a position of an electron beam by, in a structure in which a scan coil 14 is arranged as shown in FIG. 7, detecting electrons at only one point in a surface in incident electrons by using an electron detector 16 such as a Faraday cup. In this method, during the rotation operation of the electron beam 41, moving of the electron beam 41 such as the rotation operation is stopped only for a short time at the respective radiation points shown in FIGS. 3A to 3E. In that state, a scan operation is performed by a scan coil 14. A signal generated when radiated electrons pass through the electron detector 16 is amplified by an amplifier 29 and detected by the control computer 30. At the same time a position is converted and detected from a value of a current or voltage of a power source (scan coil power source) 27 which drives the scan coil 14. Moreover, as a method for detecting only one point in the surface without using the electron detector 16, there is also a method in which a pattern which allows easy discharge of secondary electrons or reflected electrons onto only one point on the observation plate 7 is prepared, and the discharged electrons are taken into the secondary-electron detector 15 shown in FIG. 7 to be detected. Those methods, which do not use an image sensor, takes an extra time, as compared with one using the image sensor. Reference sign 28 denotes a secondary-electron-detector power source.

In addition to the measurement of the example, this apparatus can be used for orbit adjustment of the aberration corrector in a state where orbit formation as a using condition of a normal aberration corrector has been performed. In this state, the electron beam 41 is made incident to the aberration corrector 6 by the condenser lens 3 to be parallel to the optical axis 40, as shown in FIG. 2D, the position of incidence is changed while the electron beam 41 is kept parallel to the axis by the deflection coils 4 as in the normal measurement in FIG. 2B, and observation of the position of radiation on the observation plate 7. This adjustment is regarded as rough adjustment before this apparatus is mounted on an SEM and an operation check. Because SEM observation is not performed, fine adjustment cannot be performed. However, a large deviation can be adjusted. The orbit adjustment conforms to Non Patent Literature 1, and it is performed that the electron beam is radiated onto an axially symmetric position with respect to the position of incidence of the deflection coils 4; moving of the beam does not occur with respect to increase or decrease of quadrupoles (alignment); and moving of the beam does not occur with respect to a dipole wobbling at a line cross position. Here, the calculation of the multipole components is not performed. Please note that, because the electron beam is not converged on the radiation position in this adjustment, calculation of a position of a center of gravity or the like is used in calculation of the radiation position.

The multipole measurement apparatus shown in FIG. 1 was used, a position of incidence and a convergence angle of an electron beam to the aberration corrector were controlled, multipole components were extracted by a change of a radiation position of the electron beam on the observation plate in accordance with excitation of a given multipole field in the aberration corrector, a measurement of a condition cancelling unnecessary multipole components and response characteristics to an input was performed, a relationship between an input value and an output field and a setting table were calculated, and by using that the aberration corrector attached to a predetermined apparatus was adjusted. As a result, the adjustment time, which conventionally took from one week to one month, could be reduced to several hours. Moreover, by this apparatus, multipole field characteristics of an aberration corrector can be examined and it is therefore possible to perform screening of aberration correctors before being mounted to a charged particle beam apparatus such as an electron microscope. In addition, since a charged particle beam can be directly observed, fine adjustment and limitation are unnecessary as compared with a case of using secondary electrons, inspection can be performed at high speed, creation of a table in which a relationship of an intensity of a multipole field excited with respect to an intensity of an input value (a voltage or a current and allocation thereof), a relationship of an adjusting field required with respect to the intensity of the multipole field, or the like is recorded can be performed easily at high speed. Furthermore, examination can be performed for a limited element such as a single stage. Therefore, separation of a problem and versatile data acquisition are possible. Since a plurality of aberration correctors can be examined by the same apparatus, the examination can be performed under a stable condition, leading to improvement in quality. Also, mass production of the aberration corrector is possible.

As described above, according to this example, a multipole measurement apparatus can be provided which includes a detector (e.g., an observation plate or an electron detector) for directly detecting charged particles passing through an aberration corrector, thereby being capable of easily acquiring table data of the aberration corrector. Thus, adjustment of the aberration corrector can be performed in a short time.

The present invention is not limited to the above-described example, but various modified examples are also included. For example, the above-described example is the one in which the present invention is described in detail for providing explanation that is easy to understand, but is not necessarily intended to limit the present invention to include all the described structures. With respect to a portion of the structure of the example, it is possible to perform addition of another structure, deletion, and/or replacement.

The invention of the present application has been described in detail above, and main embodiments of the invention are listed below.

(1) A multipole measurement apparatus including:
a radiation optical system operable to radiate a primary charged particle beam;
a two-dimensional position detector operable to detect a position coordinate on a surface onto which the primary charged particle beam is radiated;

a condenser lens operable to converge the primary charged particle beam onto the detection surface of the two-dimensional position detector;

a space between the condenser lens and the two-dimensional position detector, for allowing insertion of an aberration corrector having multiple stages of multipoles therein;

deflection coils operable to control a position of incidence and a convergence angle of the primary charged particle beam to the aberration corrector when the aberration corrector is inserted in the space;

an aberration-corrector controller operable to control an intensity and a type of a multipole excited by the aberration corrector; and a memory operable to store a relationship between the position and angle of incidence of the primary charged particle beam to the aberration corrector of the deflection coils in a state where a given multipole is excited by the aberration-corrector controller and the radiation position detected by the two-dimensional position detector, wherein the incidence of the primary charged particle beam to the aberration corrector by deflection is performed at a plurality of points, and a measurement is performed in the state where a multipole is excited and in a state where no multipole is excited regarding a relationship among the position and angle of incidence of the primary charged particle beam to the aberration corrector performed at the plurality of points, the radiation position, and the multipole, thereby extracting multipole components included in the state where the multipole is excited.

(2) A multipole measurement apparatus for calculating multipole components for adjustment to eliminate a parasitic aberration additionally generated when an aberration of a charged particle beam apparatus is corrected by an aberration corrector including a multipole, including:

an optical system including a condenser lens operable to converge a primary charged particle beam and deflection coils operable to deflect the primary charged particle beam;

a two-dimensional position detector operable to detect a position on a surface onto which the primary charged particle beam is radiated;

a space between the optical system and the two-dimensional position detector, for allowing insertion of an aberration corrector having the multipole therein;

an aberration-corrector controller operable to control the multipole of the aberration corrector inserted in the space; and an arithmetic device operable to calculate the multipole components, wherein the arithmetic device calculates the multipole components by using coordinates and convergence angles of a plurality of incident positions when the primary charged particle beam deflected by the deflection coils is incident on the aberration corrector which is set to provide a predetermined excitation intensity of a multipole field by the aberration-corrector controller, and coordinates of a plurality of radiation positions of the primary charged particle beam which has passed through the aberration corrector and is detected by the two-dimensional position detector.

REFERENCE SIGNS LIST

1 . . . Electron gun, 2 . . . Aperture, 3 . . . Condenser lens, 4 . . . Deflection coils, 5 . . . Vacuum valve, 6 . . . Aberration corrector, 7 . . . Observation plate, 8 . . . Vacuum valve, 9 . . . Secondary-electron detector, 10 . . . Electron gun column, 11 . . . Aberration corrector column, 12 . . . Observation room, 13 . . . Control unit, 14 . . . Scan coil, 15 . . . Secondary electron detector, 16 . . . Electron detector, 20 . . . Electron-gun power source, 21 . . . Condenser-lens power source, 22 . . . Deflection-coil power source, 23 . . . Vacuum-valve control unit, 24 . . . Aberration-corrector power source, 25 . . . Imaging unit, 26 . . . Secondary-electron-detector power source, 27 . . . Scan coil power source, 28 . . . Secondary-electron detector power source, 29 . . . Amplifier, 30 . . . Control computer, 31 . . . Arithmetic device, 32 . . . Operation console, 33 . . . Monitor, 34 . . . Memory, 40 . . . Optical axis, 41 . . . Electron beam, 42 . . . Point of incidence of electron beam, 43 . . . Path of point of incidence of electron beam, 50 . . . Radiation point of electron beam, 51 . . . Path of radiation point of electron beam, 52 . . . Radiation point of electron beam, 53 . . . Radiation point of electron beam.

The invention claimed is:

1. A multipole measurement apparatus comprising:
a radiation optical system operable to radiate a primary charged particle beam;
a two-dimensional position detector operable to detect a position coordinate on a surface onto which the primary charged particle beam is radiated;
a condenser lens operable to converge the primary charged particle beam onto the detection surface of the two-dimensional position detector;
a space between the condenser lens and the two-dimensional position detector, for allowing insertion of an aberration corrector having multipoles of multiple stages therein;
deflection coils operable to control a position of incidence and a convergence angle of the primary charged particle beam to the aberration corrector when the aberration corrector is inserted in the space;
an aberration-corrector controller operable to control an intensity and a type of a multipole excited in the aberration corrector; and
a memory operable to store a relationship between the position of incidence and the convergence angle of the primary charged particle beam to the aberration corrector of the deflection coils in a state where a given multipole is excited by the aberration-corrector controller and a radiation position detected by the two-dimensional position detector,
wherein the incidence of the primary charged particle beam to the aberration corrector by deflection is performed at a plurality of points, and a relationship among the position of incidence and the convergence angle of the primary charged particle beam to the aberration corrector performed at the plurality of points, the radiation position, and the multipole is measured in a state in which a multipole field is excited and in a state in which no multipole field is excited, thereby multipole components included in the state in which the multipole field is excited are extracted.

2. The multipole measurement apparatus according to claim 1, wherein
based on values of the extracted multipole components, excitation allocation for cancelling multipole components, which are generated in association with excitation of a given multipole field by the aberration-corrector controller and types of which are different from an originally intended given multipole, is calculated and recorded.

3. The multipole measurement apparatus according to claim 2,
wherein
with respect to an input value of a voltage or a current for exciting a given multipole field, an actually output intensity of the multipole field as a response is calculated, and a process in which the intensity of the multipole field is changed and the output intensity is calculated is repeated, thereby recording a relationship between the input value with respect to the intensity of the multipole field and the output.

4. The multipole measurement apparatus according to claim 1,
wherein
in the extraction of the multipole components at a given excitation intensity of the multipole field, the position of incidence and the convergence angle to the deflection coils are obtained so that, while a given axis as a reference is regarded as a center, an incident angle is kept constant and a certain distance is maintained.

5. The multipole measurement apparatus according to claim 1,
wherein
for the radiation position associated with a change between the incidences of the deflection coils in the extraction of the multipole components, an incidence condition of the deflection coils is changed in accordance with an excitation intensity of a given multipole field by the aberration-corrector controller by considering a detectable region of the two-dimensional position detector to prevent the radiation position from going out of the detectable region, and the incidence condition is fed back to the calculation of the extraction of the multipole components.

6. The multipole measurement apparatus according to claim 1,
wherein
for the radiation position associated with a change between the incidences to the deflection coils in the extraction of the multipole components, when the given multipole field is excited by the aberration-corrector controller, a condition is detected under which the radiation position detected by the two-dimensional position detector is coincident with the radiation position in the state where no multipole field is excited, and the multipole components are extracted from a difference between a value added to the deflection coils at that time and a value added while no excitation occurs.

7. A multipole measurement apparatus for calculating multipole components for adjustment to eliminate a parasitic aberration additionally generated when an aberration of a charged particle beam apparatus is corrected by an aberration corrector including a multipole, comprising:
an optical system including a condenser lens operable to converge a primary charged particle beam and deflection coils operable to deflect the primary charged particle beam;
a two-dimensional position detector operable to detect a position on a surface onto which the primary charged particle beam is radiated;
a space between the optical system and the two-dimensional position detector, for allowing insertion of an aberration corrector having the multipole therein;
an aberration-corrector controller operable to control the multipole of the aberration corrector inserted in the space; and
an arithmetic device operable to calculate the multipole components,
wherein the arithmetic device calculates the multipole components by using coordinates and convergence angles of a plurality of incident positions when the primary charged particle beam deflected by the deflection coils is incident on the aberration corrector which is set to provide a predetermined excitation intensity of a multipole field by the aberration-corrector controller, and coordinates of a plurality of radiation positions of the primary charged particle beam which has passed through the aberration corrector and is detected by the two-dimensional position detector.

8. The multipole measurement apparatus according to claim 7,
wherein
the multipole components include a dipole cosine component, a dipole sine component, a quadrupole cosine component, a quadrupole sine component, a hexapole cosine component, a hexapole sine component, an octupole cosine component, and an octupole sine component.

9. The multipole measurement apparatus according to claim 7,
wherein
the multipole components include a main component for performing originally intended aberration correction and other sub components than the main component, and the arithmetic device calculates an adjusting amount which makes the sub components zero and creates a table including an obtained value.

10. The multipole measurement apparatus according to claim 7, wherein the two-dimensional position detector is an observation plate.

11. The multipole measurement apparatus according to claim 7, further comprising a secondary electron detector between the deflection coils of the optical system and the space in which the aberration corrector is inserted.

12. The multipole measurement apparatus according to claim 7, wherein a scan coil and an electron detector are included in place of the two-dimensional position detector.

* * * * *